United States Patent
Ward et al.

(10) Patent No.: US 9,159,418 B1
(45) Date of Patent: Oct. 13, 2015

(54) HIGH DENSITY STACKED CNT MEMORY CUBE ARRAYS WITH MEMORY SELECTORS

(75) Inventors: Jonathan W. Ward, Fairfax, VA (US); Adrian N. Robinson, Haymarket, VA (US); Garo J. Derderian, Manassas, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 592 days.

(21) Appl. No.: 13/301,521

(22) Filed: Nov. 21, 2011

Related U.S. Application Data

(60) Provisional application No. 61/417,153, filed on Nov. 24, 2010.

(51) Int. Cl.
*G11C 11/00* (2006.01)
*G11C 13/02* (2006.01)

(52) U.S. Cl.
CPC .......... *G11C 13/025* (2013.01); *G11C 2213/17* (2013.01); *G11C 2213/70* (2013.01); *G11C 2213/76* (2013.01)

(58) Field of Classification Search
CPC .......... G11C 2213/76; G11C 2213/70; G11C 13/025; G11C 2213/16; G11C 2213/17
USPC .................. 365/174, 148, 180, 163
See application file for complete search history.

(56) References Cited

U.S. PATENT DOCUMENTS

| | | | |
|---|---|---|---|
| 6,331,944 B1* | 12/2001 | Monsma et al. | 365/171 |
| 7,479,654 B2 | 1/2009 | Bertin et al. | |
| 2005/0226036 A1* | 10/2005 | Aratani et al. | 365/158 |
| 2008/0212361 A1 | 9/2008 | Bertin et al. | |
| 2009/0154218 A1 | 6/2009 | Bertin et al. | |
| 2010/0001267 A1* | 1/2010 | Manning et al. | 257/40 |
| 2010/0302835 A1* | 12/2010 | Mihnea et al. | 365/148 |
| 2011/0205782 A1* | 8/2011 | Costa et al. | 365/148 |
| 2012/0127779 A1* | 5/2012 | Scheuerlein et al. | 365/148 |

OTHER PUBLICATIONS

M. Jafar and D. Haneman, Switching in amorphous-silicon device, 1994 The American Physical Society, Physical Review B vol. 49, No. 19.*

* cited by examiner

*Primary Examiner* — Han Yang
(74) *Attorney, Agent, or Firm* — McDermott Will & Emery LLP

(57) ABSTRACT

A three-dimensional (3-D) memory stack and a method of formation thereof are described. The 3-D memory stack includes a number of vertically stacked memory devices. Each memory device includes one or more memory cells. Each of the memory cells can be formed on a conductive material. Each memory device further includes one or more selector elements each configured to couple a memory cell of the one or more memory cells to a respective bit line. None of the selector elements is configured as a diode or a transistor element.

19 Claims, 10 Drawing Sheets

HIGH DENSITY STACKED CNT MEMORY CUBE ARRAYS WITH MEMORY SELECTORS

CROSS-REFERENCE TO RELATED APPLICATIONS

This application claims the benefit of priority under 35 U.S.C. §119 from U.S. Provisional Patent Application 61/417,153, filed Nov. 24, 2010, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to memory devices and, more particularly, to high density stacked CNT memory cube crosspoint arrays with selector.

BACKGROUND

A stacked carbon nanotube (CNT) memory cube array can be a three dimensional (3-D) version of a nanotube random access memory (NRAM) array, where CNT memory arrays are stacked vertically (e.g., along the z-axis). A conventional method of selecting a CNT memory cell in a two dimensional (2-D) CNT memory array (e.g., in the plane of the substrate, i.e., x-y plane) is to use a transistor switch coupled to each CNT memory cell. When the transistor switch is in a low resistance state (e.g., ON state) the CNT memory cell becomes active and can toggle between logic low and high states. One problem with the transistor switching is that the density of the memory cells is limited by the density of the underlying transistors.

Improvements in density can be obtained if diodes are employed to select the memory cells instead of transistors. Replacing transistors with diodes provides a potential for CNT memory cell sizes of the order of less than 10 $f^2$, where f represents a lowest feature size (e.g., 45 nm) of the applied fabrication technology. Despite the potential density improvements resulting from using diodes to replace switch transistors and/or employing some photolithography tricks (which are not necessarily transferable to real integration), the density of the CNT memory devices are still heavily limited by the 2-D structure of the CNT memory devices and the underlying addressing circuitry. Therefore, high density CNT memory devices are desirable.

SUMMARY

In some aspects, a three-dimensional (3-D) carbon nanotube (CNT) memory stack is described. The 3-D memory stack includes a number of vertically stacked CNT memory devices. Each memory device includes one or more CNT memory cells. Each of the CNT memory cells can be formed on a conductive material. Each memory device further includes one or more selector elements. Each selector element is configured to couple a memory cell of the one or more memory cells to a respective bit line. None of the selector elements is configured as a diode or a transistor element.

In another aspect, a method for forming a 3-D stacked CNT memory is provided. The method includes forming a plurality of CNT memory devices stacked vertically. Forming of each CNT memory device can include forming a CNT memory cell over a first conductive layer, and forming a selector element over the CNT memory cell. The selector element can be formed to couple the CNT memory cell to a respective bit line. The selector element, however, does not form a diode or a transistor element.

In yet another aspect, a method of operating a CNT memory device is described. The method includes coupling a word line of a CNT memory cell to a first voltage, where the CNT memory cell can be one of a number of memory cells of a 3-D stacked CNT memory. The method may also include coupling a bit line of the CNT memory cell to a second voltage, wherein the bit line is coupled to the second voltage via a selector element that is not configured as a diode or a transistor element.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to high density stacked carbon nanotube (CNT) memory cube arrays (hereinafter "CNT memory array") with memory selectors. The high density is provided by stacking a number of two dimensional (2-D) CNT memory arrays to form a three-dimensional (3-D) CNT memory stack. The 3-D CNT memory stack includes a number of vertically stacked CNT memory devices (e.g., arrays). Each CNT memory device includes one or more CNT memory cells. Each of the CNT memory cells can be formed on a conductive material, which can be used as a word line. Each memory device further includes one or more selector elements. Each selector element is configured to couple a memory cell of the memory cells to a respective bit line.

One important aspect of the present disclosure is that none of the selector elements is required to be configured as a diode or a transistor element. In the disclosed embodiments, the selector element can be realized by a material having nonlinear resistance such as amorphous silicon (a-Si). One important advantage of the disclosed selector element is that it allows the disclosed CNT memory stack to be formed in any level of a semiconductor chip, for example, in a back-end layer, a front-end layer, or a middle layer. In other words, the disclosed CNT memory stack does not have to be processed with other semiconductor devices in a front layer, and can be formed in the back-end layer, which is much less demanding in terms of process requirements. This advantage arises from the fact that the nonlinear resistor (e.g., a-Si) can be fabricated in a back-end layer independent of the type of the substrate material and the semiconductor material (e.g., Si, GaAs, InP, and the like) used for fabricating other devices on the chip. Further, the density of the disclosed CNT memory stack is not limited by the density of the underlying devices, such as transistors (e.g., Si MOS transistors).

Figure 1B:
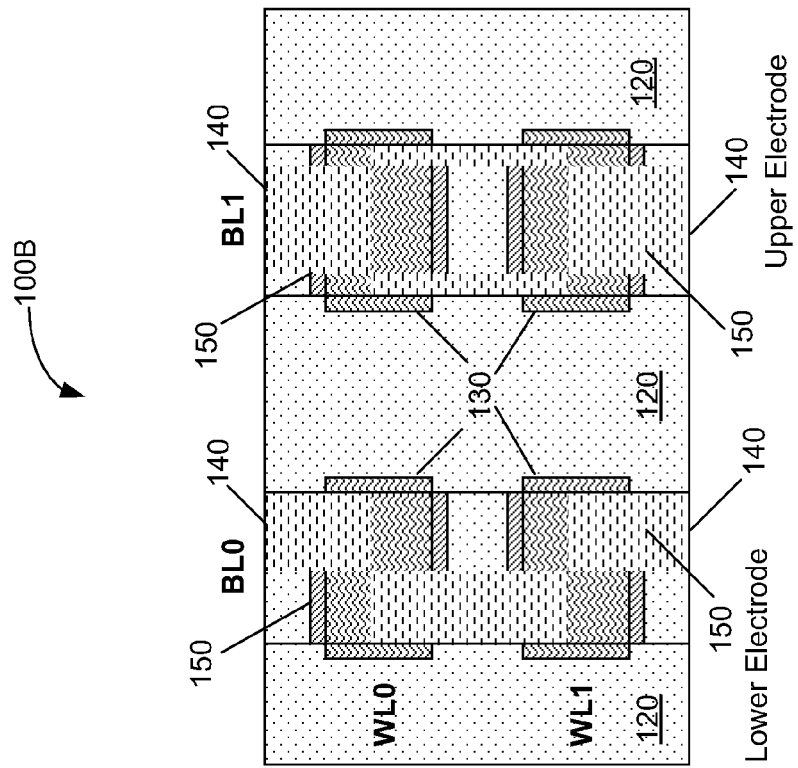
FIG. 1B is a diagram illustrating a top-view of an example 2-D CNT memory array.
Figure 1A:
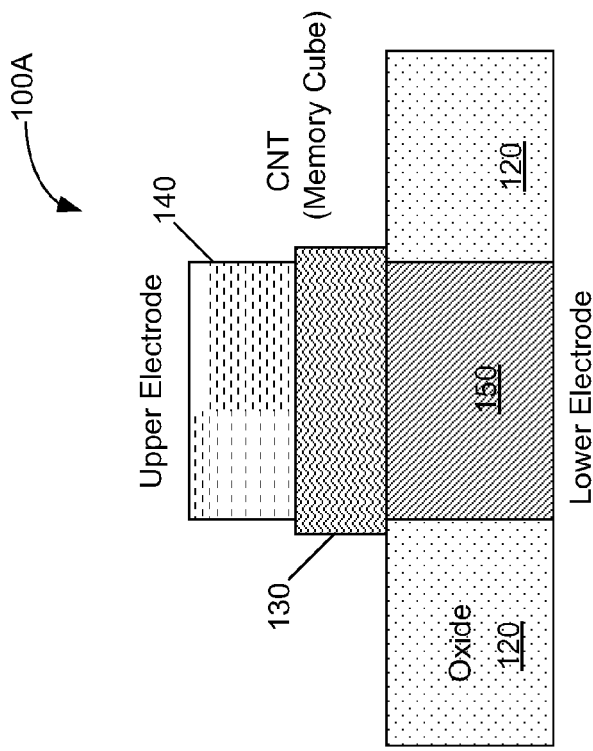
FIG. 1A is a diagram illustrating a cross-sectional view of an example carbon nanotube (CNT) memory cell.

FIG. 1A is diagram illustrating a cross-sectional view of an example CNT memory cell 100A. CNT memory cell 100A includes a CNT memory fabric (e.g., memory cube) 130 formed over a lower electrode 150 and covered by an upper electrode 140 and surrounded by a dielectric layer 120. CNT memory fabric 130 may comprise a version of the nanotube-random-access-memory (NRAM), and can be formed by well-known nanotechnology processes using CNT material. Lower and upper electrodes 150 and 140 may be comprised of a conducting material (e.g., a metal conductor such as copper, silver, gold, tungsten, aluminum, TiN, and the like). The dielectric layer 120 may be comprised of any non-conducting material such as, but not limited to, oxides, for example, SiO2, SiNx, and Alumina. CNT memory cell 100A may be formed on a bottom conducting layer, which in turn may be formed on a substrate (e.g., silicon).

FIG. 1B is diagram illustrating a top-view of an example 2-D CNT memory array 100B. CNT memory array 100B may include a number of CNT memory devices 100A of FIG. 1A. For simplicity, only four memory devices are shown in FIG. 1B, with their respective upper and lower electrodes 140 and 150, and CNT memory fabrics 130. Upper electrode 140 of memory devices formed on a vertical line (e.g. a column) can be interconnected to form the respective bit line (e.g., BL0 and BL1) for the CNT memory devices in that column. Lower electrode 150 of memory devices formed on a horizontal line (e.g. a row) can be interconnected to form the respective word line (e.g., WL0 and WL1) for the CNT memory devices in that row.

Figure 2:
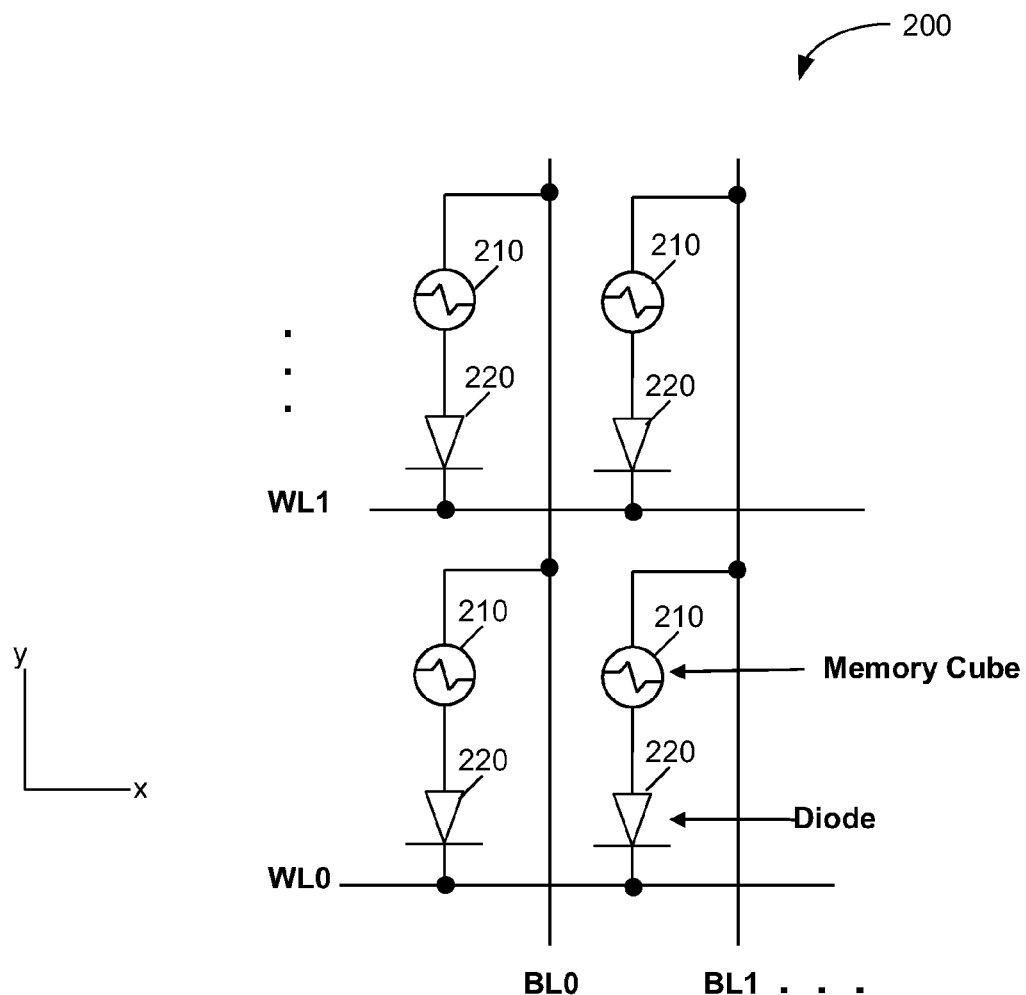
FIG. 2 is a diagram illustrating an example 2-D CNT memory array with diode selectors.

FIG. 2 is a schematic diagram illustrating an example 2-D CNT memory array 200 with diode selectors. Memory array 200 includes a number of CNT memory cells 210 and a corresponding number of diode switches 220. For simplicity, only four CNT memory cells 210 and diode switches 220 are shown. An electrode (e.g., upper electrode 140 of FIG. 1A) of each CNT memory cell 210 is coupled to a bit line (e.g., BL0 or BL1). A lower electrode of each CNT memory cell 210 is coupled through one of diode switches 220 to a word line (e.g., WL0 or WL1). Applying proper voltages to a bit line and a word line corresponding to a selected CNT memory cell 210 can turn on a corresponding switch 220, thereby allowing the selected CNT memory cell 210 to toggle.

Figure 3:
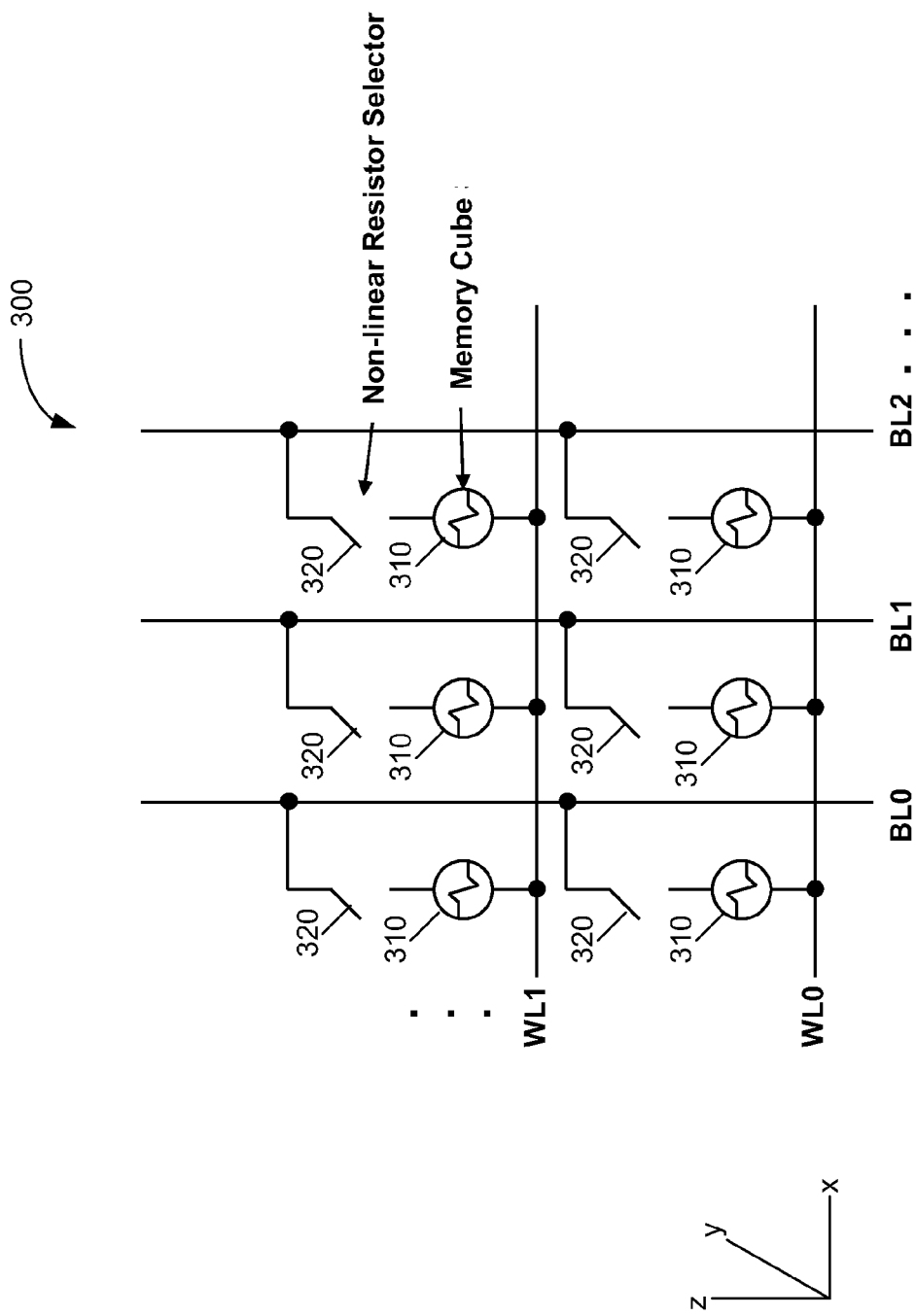
FIG. 3 is a schematic diagram illustrating an example three-dimensional (3-D) CNT memory array with nonlinear resistor selectors, according to certain embodiments.
Figure 5:
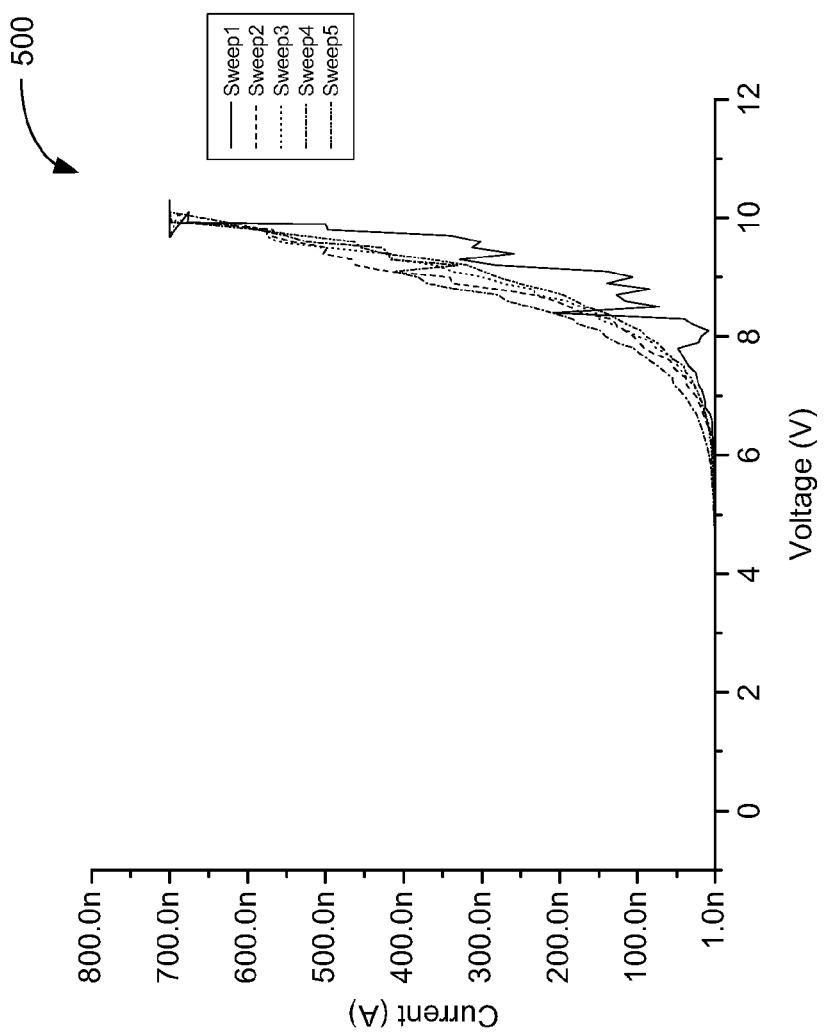
FIG. 5 is a diagram illustrating example I-V characteristics of a nonlinear resistor selector, according to certain embodiments.

FIG. 3 is diagram illustrating an example three-dimensional (3-D) CNT memory array 300 with nonlinear resistor selectors 320, according to certain embodiments. The 3-D CNT memory array 300 includes a number of layers stacked on the top of one another (for simplicity, only one layer is shown). Each layer includes a number of CNT memory cells 310 and a corresponding number of selector elements 320. For simplicity, only six CNT memory cells 310 and corresponding selector elements 320 are shown. Each selector elements 320 may be implemented using a nonlinear resistor. In some embodiments, the nonlinear resistor may comprise, but is not limited to, amorphous silicon (a-Si), which, as depicted in FIG. 5, shows a nonlinear behavior. In some embodiments, other materials with nonlinear resistance or other appropriate characteristics may be used. The a-Si selector 320 can play the role of a diode switch (e.g., diode switch 220 of FIG. 2) or a transistor switch and can advantageously be used to select a CNT memory cell 310, as discussed in more detail herein with respect to FIG. 6.

The stacking of CNT memory arrays, not only drastically improves memory device density, but also results in significant reduction in power consumption. This is specially true for CNT memory arrays with nonlinear resistor selectors, which do not require interconnect lines to underlying silicon and reduce interconnect lines between CNT memory cells, therefore, resulting in much lower capacitance (i.e. interconnect line capacitance). The advantage of using a-Si selectors instead of diode or transistor switches is multiple-fold. First, using the a-Si selector instead of the diode or transistor switches allows for high density implementation by facilitating 3-D realization as a result of independence from the underlying semiconductor devices for selecting the CNT memory cells. This will result in saving on valuable silicon real estate. Second, using a-Si selectors instead of diode or transistor switches permits fabrication of the CNT memory cells and the corresponding selectors (i.e. a-Si selectors) on other levels (e.g., back-end level) of the semiconductor chip than the font-end level. This can ease fabrication requirements associated with the front-end level, thus resulting in fewer complications in processing and lower cost of production. Finally, processing of the CNT memory cells with a-Si selectors in the back-end level allows for on-demand memory additions to any type of semiconductor chip to achieve additional functionalities. For example, an audio/video processing chip can be upgraded by adding some features or functionalities that require increased memory capacity. Using the disclosed technology, the manufacturer of the audio/video processing chip can use the existing design of the chip and, in the fabrication stage, while keeping the font-end processes intact, add the additional memory in the back-end stage of the process. The process of implementing of CNT memory cells with a-Si selectors are described with respect to FIGS. 4A and 4B below.

Figure 4A:
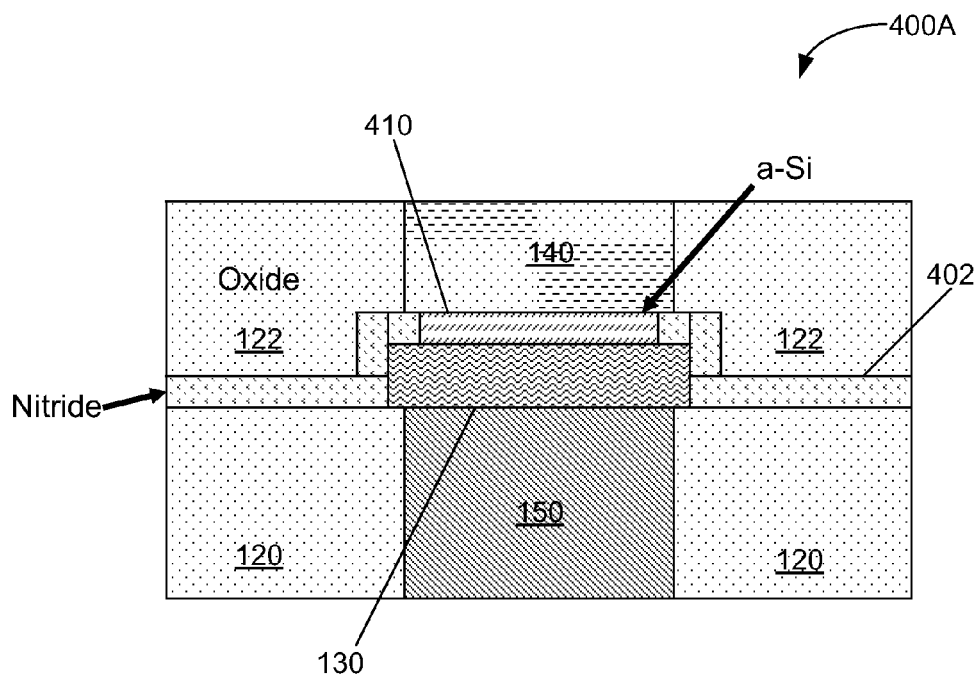
FIG. 4A is a diagram illustrating an example CNT memory device with an integrated non-linear resistor selector, according to certain embodiments.

FIG. 4A is a diagram illustrating an example CNT memory device 400A with an integrated non-linear resistor 410, according to certain embodiments. For simplicity, CNT memory device 400A is shown to include only one CNT memory cell. Embodiments may include a number of CNT memory cells. CNT memory device 400A is different from the memory cell 100A of FIG. 1, in the sense that it includes non-linear resistor (e.g., a-Si selector) selector 410 integrated with a CNT memory cell during the processing of the memory device. The processing of a first portion, including lower electrode 150, dielectric layer 120, and CNT memory fabric 130, of the CNT memory cell 400A is similar to the processing of the corresponding layers of memory cell 100A. In an embodiment, the CNT memory fabric 130 may be replaced by a carbon-based resistive material such as graphene and amorphous carbon (a-C). In processing of a second portion of CNT memory device 400A, after completion of formation of the lower portion, a passivation layer 402, such as a layer of silicon nitride ($Si_3N_4$), may be formed to cover the first portion. The passivation layer 402 is partially etched to expose CNT memory fabric 130 by making an opening in the passivation layer 402 covering a top surface of CNT memory fabric 130. A coating of a-Si material over the exposed portion of CNT memory fabric 130 forms a-Si selector 410.

It is important to note here that using a-Si selectors allows using thin layers (e.g., with a thickness of approximately 1 nm) of CNT material to form CNT memory fabric 130. This is because penetration of a-Si material into CNT material would not interfere with proper functioning of the CNT memory fabric 130. This may not be the case for situations where selectors other than a-Si selector, such as transistor or diode selectors are used. In these situations thicker layers of CNT material may be required to prevent undesirable effects resulting from penetration of metal or oxide atoms or molecules into the CNT material. Using thicker layers of CNT material may require higher switching voltages. Therefore, using a-Si selector can result in lower applied switching voltages.

Returning to processing of the second portion of CNT memory device 400A, after formation of the a-Si layer, a step of planarization (e.g., chemical-mechanical planarization) is performed before dielectric layer 122 is formed on the in-process CNT memory device 400A. In a next step, an opening is made in the dielectric layer 122 to form upper electrode 140.

Figure 4B:
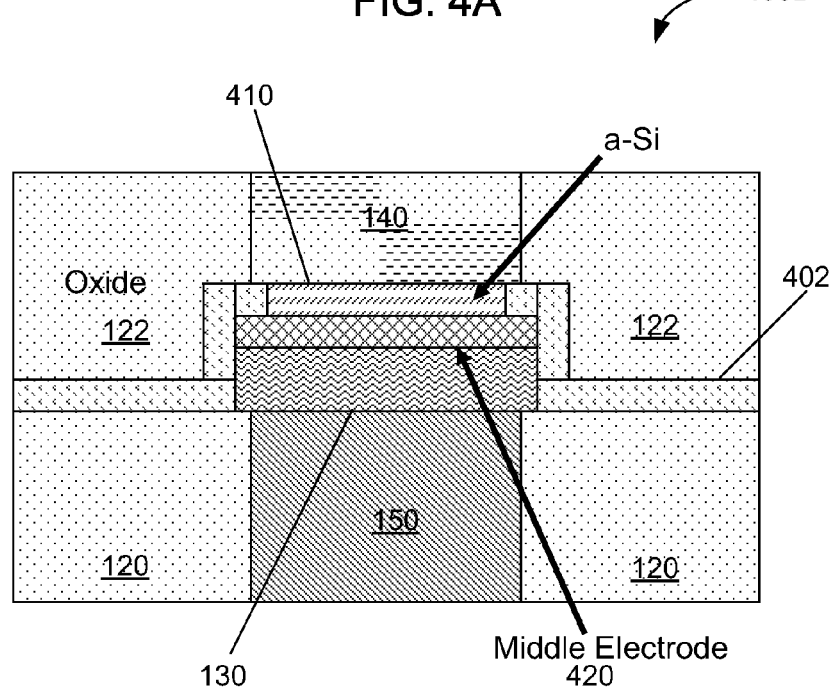
FIG. 4B is a diagram illustrating another example CNT memory device with an integrated non-linear resistor selector, according to certain embodiments.

FIG. 4B is a diagram illustrating another example of a CNT memory device 400B with an integrated non-linear resistor selector 410, according to certain embodiments. The structure of CNT memory device 400B is different from CNT memory device 400A of FIG. 4, only in the fact that CNT memory device 400B includes a middle electrode 420, which does not exist in CNT memory device 400A. Middle electrode 420 may comprise any conducting material such as a metal (e.g., copper, aluminum, silver, gold, tungsten, TiN, etc.). Middle electrode 420 may be formed between CNT memory fabric 130 and non-linear resistor selector 410. The implementation of the middle electrode 420 may reduce the contact resistance between the CNT memory fabric 130 and non-linear resistor selector 410.

FIG. 5 is diagram illustrating example I-V characteristics 500 of a nonlinear resistor selector, according to certain embodiments. Any nonlinear resistor showing an I-V characteristic similar to I-V characteristics 500 may be used as the memory selector for CNT memory cells of FIG. 3. However, as mentioned before, use of a-Si selectors may be advantageous because, among other reasons, it allows for thinner CNT memory fabrics. I-V characteristics 500 correspond to multiple measurements (i.e., sweeps) of an a-Si selector. Various measurements show more or less similar I-V characteristics, with some fluctuations, indicating consistency of the data represented by the I-V characteristics. The nonlinear behavior of the I-V characteristics 500 of a-Si selector can be utilized to operate the a-Si selector as a switch selector that can turn into a conducting mode of operation (i.e., ON) when the voltage across the a-Si selector is greater than a threshold voltage (e.g., approximately 5V). Different a-Si selectors may have different I-V characteristic based on details of their fabrication process and use of any doping material (such as n or p doping materials) to change resistivity of the a-Si material.

Figure 6:
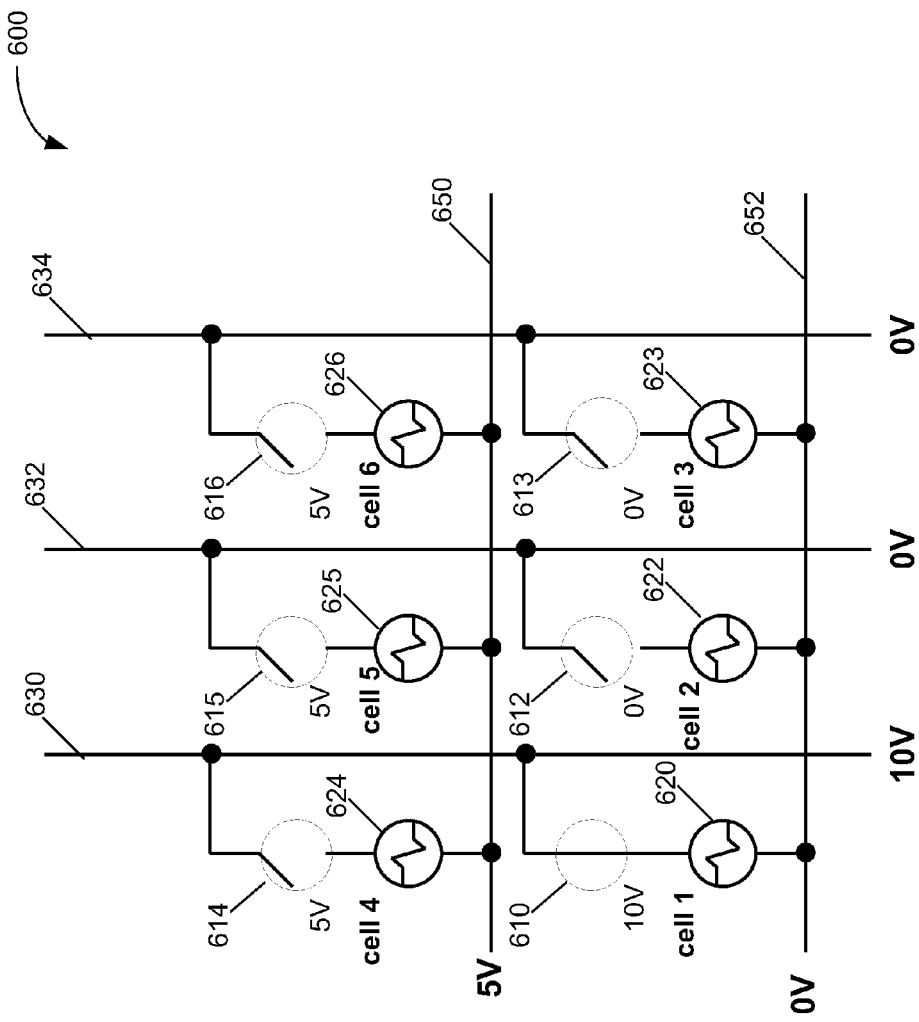
FIG. 6 is a schematic diagram illustrating an example of a 3-D CNT memory array, where each memory cell is selected by a corresponding nonlinear resistor selector, according to certain embodiments.

FIG. 6 is diagram illustrating an example 3-D CNT memory array 600, where each memory cell is selected by a corresponding nonlinear resistor selector, according to certain embodiments. The 3-D CNT memory array 600 (hereinafter "memory array 600") may include one or more layers, each layer comprising a memory array including a number of memory cells and a corresponding number of memory selectors. For simplicity, in FIG. 6, only one memory array with only six memory cells 620, 622, 623, 624, 625, and 626 and six memory selectors 610, 612, 613, 614, 615, and 616 are shown. An actual device can include multiple layers (e.g. up to 8 layers), and each layer may include a memory array that includes many memory cells and memory selectors. One electrode (e.g., lower electrode 150 of FIG. 4) of the each memory cell (e.g., memory cells 620, 622, 623, 624, 625, and 626) is directly connected to a word line (e.g., word lines 650-652). The other electrode (e.g., upper electrode 140 of FIG. 4) may be coupled to a bit line (e.g., a bit line 630, 632 or 634) through a nonlinear resistor selector (e.g., one of nonlinear selectors 610, 612, 613, 614, 615, and 616).

As discussed above, a-Si selectors may advantageously be used as nonlinear selectors 610-616. Using proper voltages on bit lines 630, 632, and 634 and word lined 650 and 652, one of the CNT memory cells 620, 622, 623, 624, 625, and 626 may be selected for a read/write (R/W) operation. For example, to operate memory cell 620, word lines 650 and 652 are connected to voltage levels of 5V and 0V, respectively, while simultaneously, a voltage level of 10V is applied to bit line 630 and a voltage level of 0V is applied to each of the bit lines 632 and 634. In this applied voltage configuration, only a-Si selector 610 is biased by a voltage greater than its threshold voltage of approximately 5V. Therefore, only a-Si selector 610 is in a low resistance state that can allow current to pass through CNT memory cell 620 to cause it to toggle (e.g., change state e.g., from a logical low state to logical high state or vice versa). Other a-Si selectors (e.g., 612, 613, 614, 615, and 616) are in a high resistance state and cannot allow the corresponding memory cell (e.g., 622, 623, 624, 625, and 626) to toggle. In other words, for the memory array 600, in order to select a memory cell, voltage levels of 10V and 0V are respectively applied to its corresponding bit line and word line, while simultaneously, a voltage level of 0V is applied to the remaining bit lines and a voltage level of 5V is applied to the remaining word lines of the memory array 600, respectively.

FIG. 7A is diagram illustrating a top view of an example 3-D CNT memory array 700 with nonlinear resistor selectors, according to certain embodiments. A 3-D CNT memory array 700 (hereinafter "memory array 700") can be realized in a stack configuration, where each layer of the stack may include a number of memory cells, with their corresponding memory selectors, arranged in columns and rows. For example, in memory array 700, as shown in the top view of FIG. 7A, for simplicity, only four memory devices 710, 712, 714, and 716 are shown, where each memory device includes two memory cells with their corresponding memory selectors. The structure of each memory device can be better understood from the cross sectional views A-A' and B-B' described in FIGS. 7B and 7C. The numeral references 724, 732, 740, 752 and 752-1 relate to the corresponding numeral references shown in FIGS. 7B and 7C and are discussed below with respect to these figures.

FIG. 7B is diagram illustrating a cross sectional view A-A' of the example memory array 700 shown in FIG. 7A, according to certain embodiments. The cross sectional view of memory device 700 as shown in FIG. 7B only illustrates the cross sectional view A-A' of one of memory devices 710 or 716 of FIG. 7A. Memory device 700, as seen, from the cross sectional view A-A', comprises two memory cell, a top memory cell and a bottom memory cell. Both the top and bottom memory cells includes their corresponding memory selectors and share a bit line 740 (e.g., BL1). The bottom memory cell includes an dielectric layer 720. A conductor layer 750 (e.g., WL0), a CNT memory fabric 730, a memory selector (e.g., a nonlinear resistor such as a-Si) 760, a sandwiched conductor 740 (e.g., shared bit line BL1), a passivation layer (e.g., silicon nitride) 772 and a dielectric layer 722. The top device has a structure similar to the bottom device except that it is inverted. The top device includes the shared bit line 740, a memory selector (e.g., nonlinear resistance such as a-Si) 762, a CNT memory fabric 732, a passivation layer 774, a dielectric layer 724 and a conductor layer 752 (e.g., WL1). Word line 752 (i.e., WL1), CNT memory fabric 732 and bit line 740 are also visible in the top view shown in FIG. 7A. In an embodiment, the CNT memory fabrics 730 and 732 may be replaced by a carbon-based resistive material such as graphene and amorphous carbon (a-C).

Figure 7:
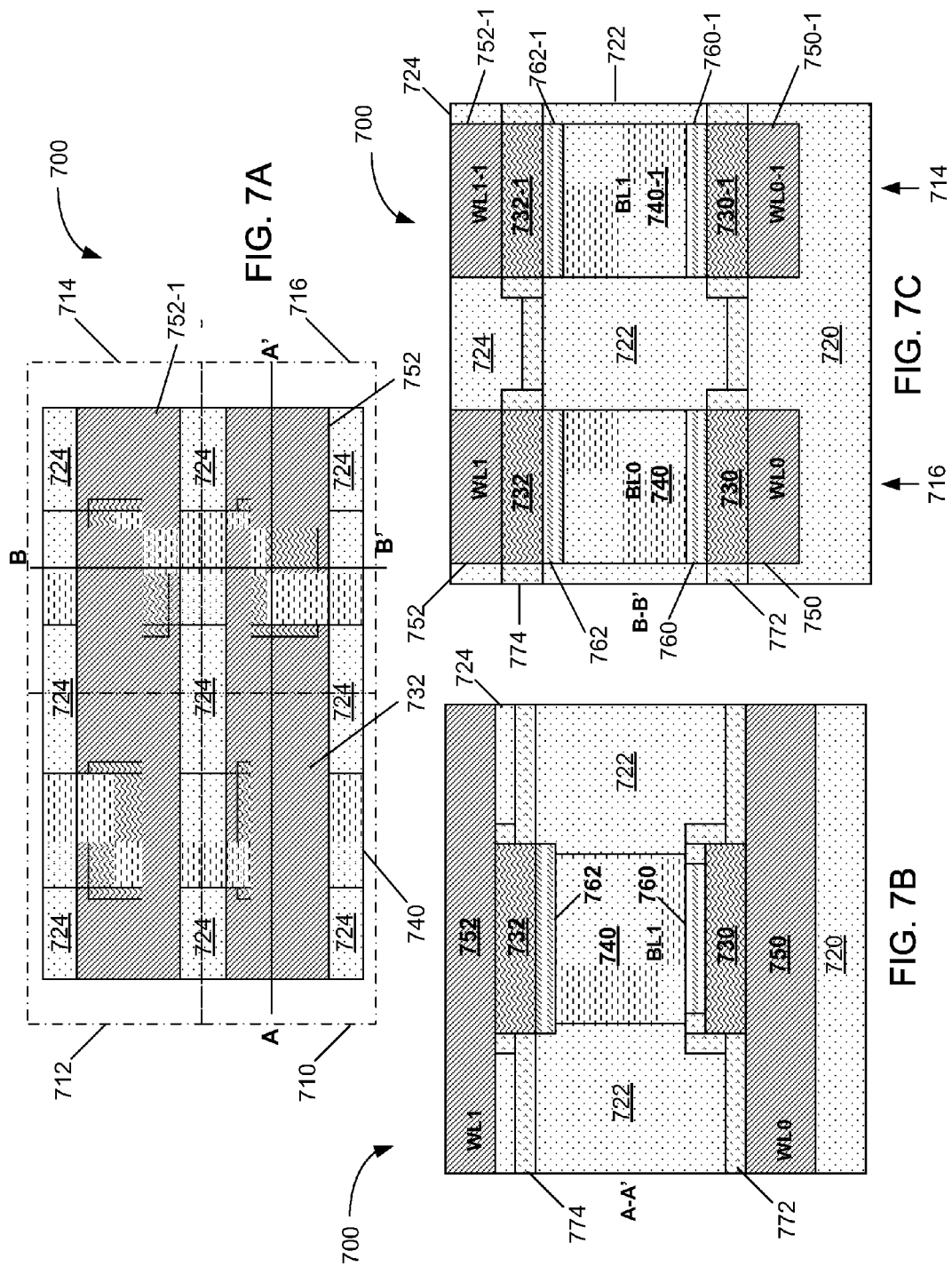
FIG. 7A is a diagram illustrating a top view of an example 3-D CNT memory array with nonlinear resistor selectors, according to certain embodiments.
FIG. 7B is a diagram illustrating a cross sectional view A-A' of the example 3-D CNT memory array shown in FIG. 7A, according to certain embodiments.
FIG. 7C is a diagram illustrating a cross sectional view B-B' of the example 3-D CNT memory array shown in FIG. 7A, according to certain embodiments.

FIG. 7C is diagram illustrating a cross sectional view B-B' of the example memory array 700 shown in FIG. 7A, according to certain embodiments. The cross sectional view of memory device 700 as shown in FIG. 7C illustrates the cross sectional view B-B' of side-by-side memory devices 714 and 716 of FIG. 7A. Memory device 700, as seen, from the cross sectional view B-B', comprises two side-by-side memory devices each including a top memory cell and a bottom memory cell, as described with respect to FIG. 7 B. Since the left-hand-side device corresponds to memory device 716 of FIG. 7A, its numerical references are similar to those used for FIG. 7B, which can also represent memory device 716. For the right-hand-side device that corresponds to memory device 714 of FIG. 7A, although the structure is similar to memory device 716, somewhat distinguished numeral references (e.g., by addition of a 1 to corresponding reference numerals used for memory device 716, for example, 730-1, 732-1, 740-1, 750-1, 752-1, 762-1, WL0-1 and WL1-1) are used. Otherwise, in view of FIGS. 7A and 7B, FIG. 7C is self-explanatory. Again in the memory devices 714 and 716, bit lines BL0 and BL1 are shared between the corresponding top and bottom memory cells of the memory devices 714 and 716. The memory devices 714 and 716 share dielectric layers 720, 722, and 724 and passivation layers 772 and 774.

Figure 8:
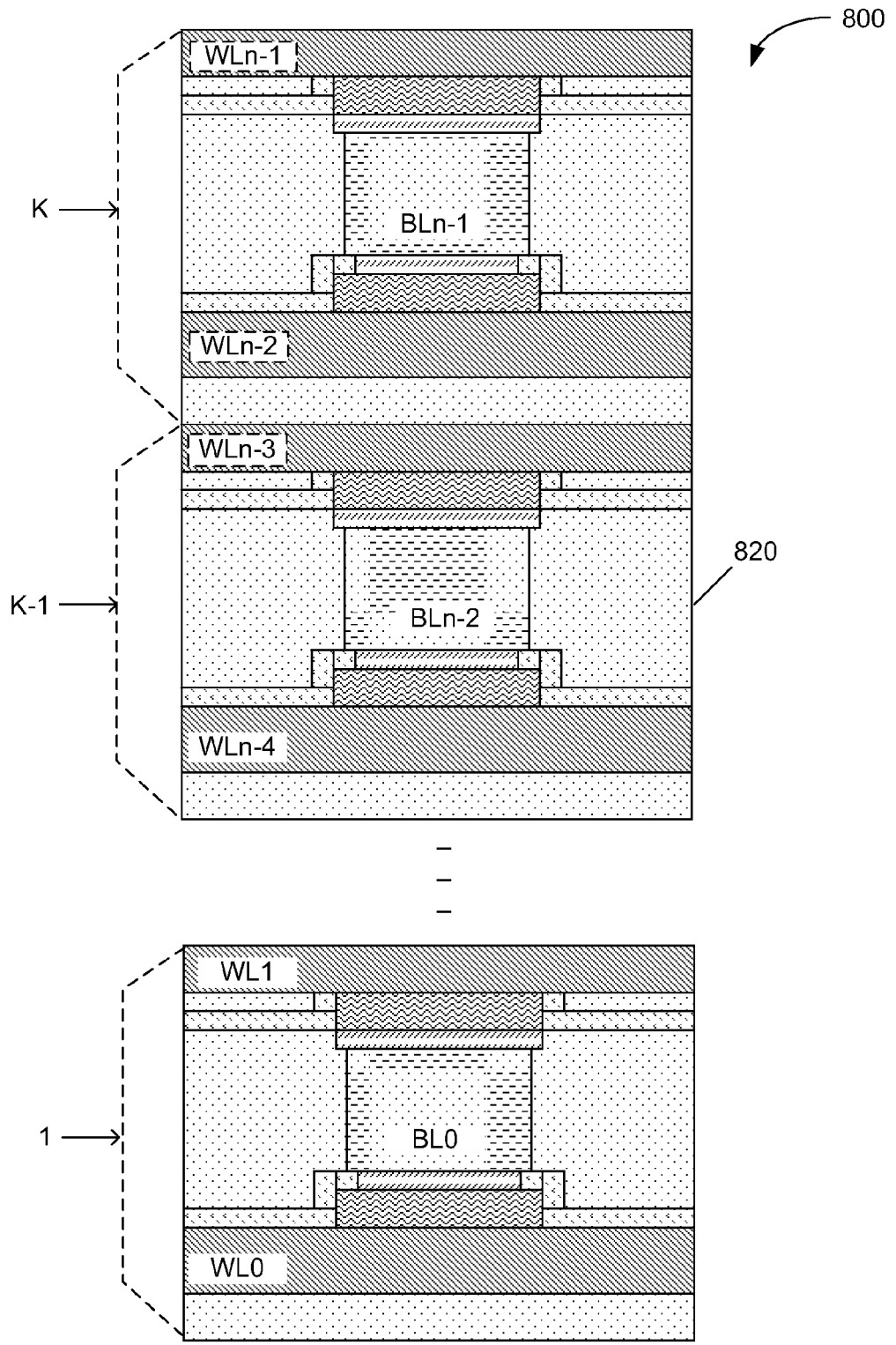
FIG. 8 is a diagram illustrating a cross sectional view of an example 3-D stack of memory cells shown in FIGS. 7A-7C, according to certain embodiments.

FIG. 8 is diagram illustrating cross sectional view of an example 3-D stack 800 of CNT memory device of FIGS. 7A-7C, according to certain embodiments. For simplicity, only stacking of one set of devices (e.g., any of memory devices 710, 712, 714, or 716 of FIG. 7A) is shown in 3-D stack 800. In other words, 3-D stack 800 can expand on both sides to show a full cross sectional view of a 3-D CNT memory stack including many memory cells in each layer. Each of the memory devices shown in layers 1 to K may represent one of the memory devices of FIG. 7B described above. The stacking configuration is quite efficient as it allows some vertically neighboring CNT memory cells to share a common bit line (e.g., BLn-2) and a common dielectric layer (e.g., dielectric layer 820).

Figure 9:
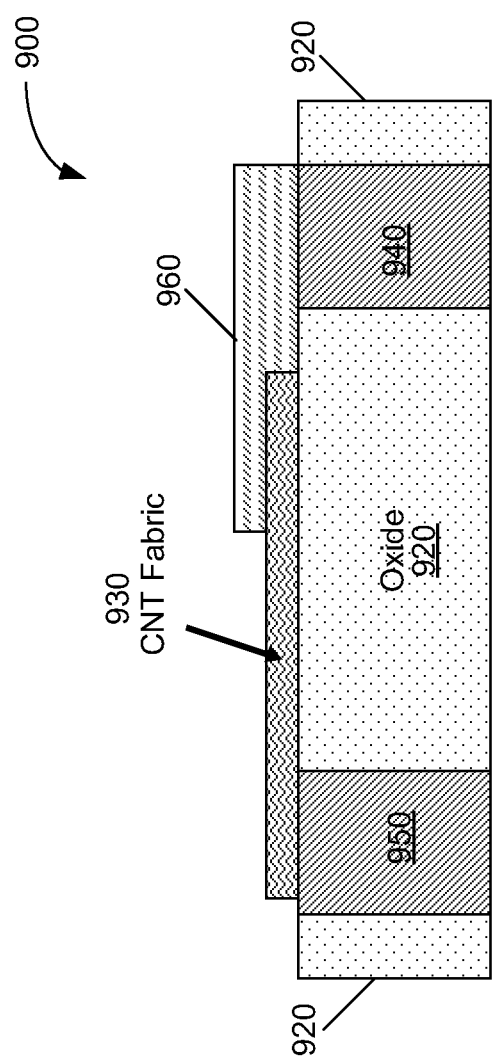
FIG. 9 is a diagram illustrating an example memory cell of a 3-D CNT memory array with nonlinear resistor selectors, according to certain embodiments.

FIG. 9 is diagram illustrating an example memory cell 900 of a 3-D CNT memory array with nonlinear resistor selectors, according to certain embodiments. Memory cell 900 is structurally somewhat similar to any memory cell of FIG. 4A, except that memory cell 900 is implemented in a horizontal configuration. Memory cell 900 includes a dielectric layer 920, a CNT memory fabric 930, and a nonlinear resistor (e.g., a-Si) selector 960. The connections to a-Si selector 960 and CNT fabric 930 are provided through conductive vias 940 and 950, respectively, which pass through dielectric layer 920. Memory cell 900 can be stacked to form a stacked 3-D CNT memory array. Conductive vias 940 and 950 may respectively form word and bit lines of memory cell 900. In an embodiment, the CNT memory fabric 930 may be replaced by a carbon-based resistive material such as graphene and amorphous carbon (a-C).

Figure 10:
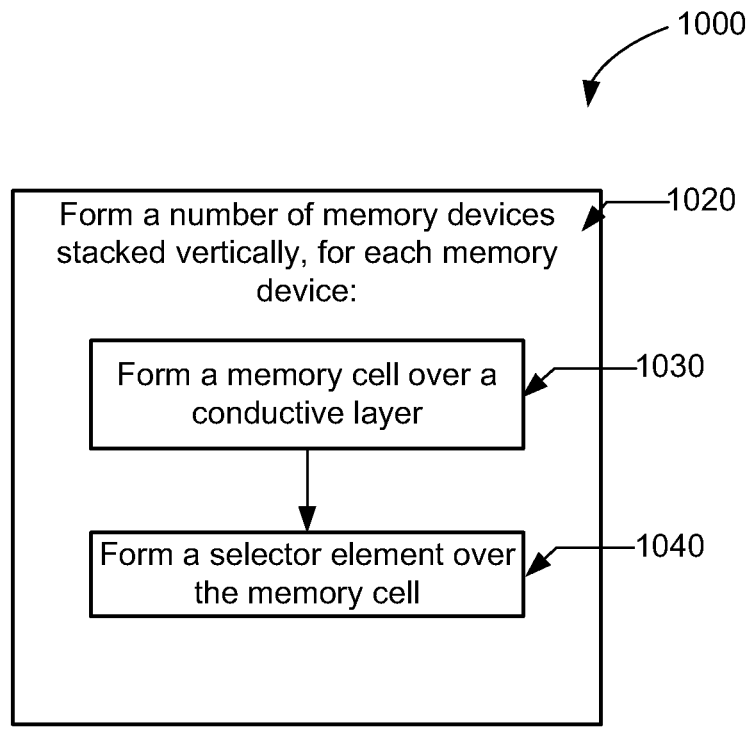
FIG. 10 is a flow diagram illustrating a method of forming a 3-D CNT memory array with nonlinear resistor selectors, according to certain embodiments.

FIG. 10 is a flow diagram illustrating a method 1000 for forming a 3-D CNT memory array 800 with nonlinear resistor selectors, according to certain embodiments. The method may include forming a number of vertically stacked devices (e.g., CNT memory stack devices of FIG. 8) (1020). Each memory device can be formed by a fabricating a memory cell (e.g., memory cell 400A of FIG. 4A) including lower conductor 150 and CNT memory fabric 130, as described with respect to FIG. 4A (1030). The fabrication of the memory device also includes formation of a selector element (e.g., nonlinear resistor selector, such a-Si selector 410 of FIG. 4A) on the memory cell 400A (1040). Selector element 410 is configured to couple the memory cell to a respective bit line (e.g., conductive element 140 forming any of bit lines BL0, BL1, or BL2 of FIG. 3). In an embodiment, the CNT memory fabric 130 may be replaced by a carbon-based resistive material such as graphene and amorphous carbon (a-C).

Figure 11:
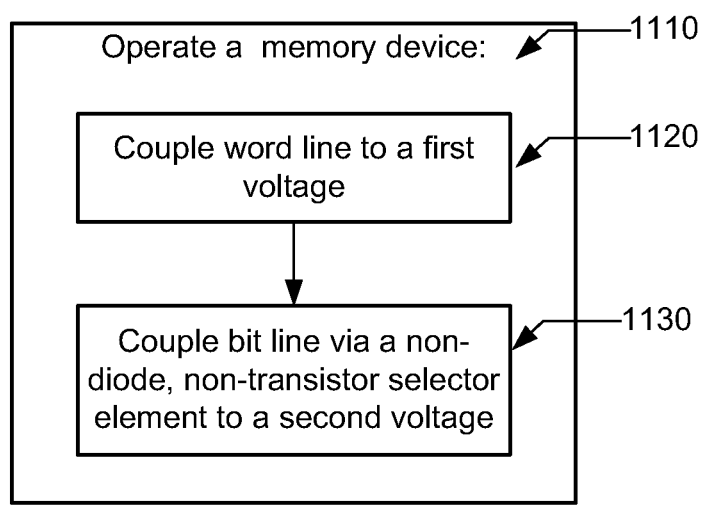
FIG. 11 is a flow diagram illustrating a method of operating a 3-D CNT memory array with nonlinear resistor selectors, according to certain embodiments.

FIG. 11 is a flow diagram illustrating a method 1100 of operating a 3-D CNT memory array with nonlinear resistor selectors, according to certain embodiments. Operation of a 3-D CNT memory device (1110) is based on selection of a memory cell for R/W operation. For example, to perform a R/W operation on a cell (e.g., memory cell 620 of FIG. 6) of the 3-D CNT memory device 600 of FIG. 6, a word line 652 of the memory cell 620 of FIG. 6 is coupled to a first voltage (e.g., 0V) (1120). Simultaneously, a bitline 630 of the memory cell 620, which is coupled to the memory cell 620 via the selector element (e.g., a-Si selector 610), is coupled to a second voltage (e.g., 10V) (1130).

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. A three-dimensional (3-D) memory stack comprising:
a plurality of memory devices vertically stacked to form the 3-D memory stack, each memory device including:
at least one memory cell, each of the memory cells being formed of carbon nanotube (CNT) material on and in electrical connection with a conductive layer that forms a word line of the 3-D memory stack; and
at least one selector element, each of the selector elements configured to couple a memory cell of the memory cells to a respective bit line, wherein the 3-D memory stack is formed in a middle layer of a semiconductor chip, and the selector elements are configured as non-diode and non-transistor elements in direct contact with CNT memory cells.

2. The 3-D memory stack of claim 1, wherein the selector element comprises a nonlinear resistor.

3. The 3-D memory stack of claim 2, wherein the nonlinear resistor comprises amorphous silicon, and wherein using the amorphous silicon selector element allows for increased density of the memory stack.

4. The 3-D memory stack of claim 2, wherein the nonlinear resistor allows using thin layers of CNT material to form the memory cell.

5. The 3-D memory stack of claim 1, wherein at least some adjacent memory devices of the memory stack share common bit lines.

6. The 3-D memory stack of claim 1, wherein the memory cell is configured to be selected for a read-write operation by applying a first voltage to the word line and a second voltage to the bit line, wherein the first voltage is smaller than the second voltage.

7. A method, for forming a three-dimensional (3-D) stacked memory, comprising:
forming a plurality of memory devices stacked vertically to form the 3-D stacked memory in a middle layer of a semiconductor chip, and forming of each memory device including:
forming a memory cell on and in connection with a first conductive layer that forms a word line of the 3-D stacked memory, the memory cell being formed of carbon nanotube (CNT) material; and
forming a selector element, the selector element formed to couple the memory cell to a respective bit line, wherein the selector element does not form a diode or a transistor element elements and is in direct contact with a CNT memory cell.

8. The method of claim 7, wherein forming the selector element comprises forming a layer of a material having a nonlinear resistance.

9. The method of claim 8, wherein forming the material having the nonlinear resistance comprises forming an amorphous silicon layer.

10. The method of claim 8, wherein forming the material having nonlinear resistance allows forming the memory cell by forming a thin layer of the CNT material.

11. The method of claim 7, further comprising forming a second conductive layer between the memory cell and the selector element.

12. The method of claim 7, further comprising forming a third conductive layer over the selector element to form the bit line.

13. The method of claim 12, further comprising forming two adjacent memory devices by allowing the two adjacent memory devices to share common bit lines.

14. A three-dimensional (3-D) memory stack comprising:
a plurality of memory arrays vertically stacked in a middle layer of a semiconductor chip, and each memory array including one or more memory-cell pairs, each memory cell pair of the one or more memory-cell pairs comprising:
at least two carbon nanotube (CNT) memory cells vertically stacked and coupled to respective word lines and a single shared bit line that is formed in between the at least two memory cells;
at least two selector elements, each of the selector elements configured to couple a memory cell of the at least two memory cells to the single shared bit line, wherein the at least two selector elements are configured as non-diode or non-transistor elements in direct contact with the CNT memory cells.

15. The 3-D memory stack of claim 14, wherein the one or more memory-cell pairs comprise horizontally arranged memory-cell pairs.

16. The 3-D memory stack of claim 14, wherein each of the selector elements is formed using a layer of a material having a nonlinear resistance.

17. The 3-D memory stack of claim 16, wherein the nonlinear resistor comprises amorphous silicon, and wherein using the amorphous silicon selector element allows for increased density of the memory stack.

18. The 3-D memory stack of claim 16, wherein the nonlinear resistor allows using thin layers of CNT material to form the memory cell.

19. The 3-D memory stack of claim 14, wherein at least some adjacent memory devices of the memory stack share common bit lines.

* * * * *